(12) United States Patent
Furuya (10) Patent No.: US 8,778,112 B2
(45) Date of Patent: Jul. 15, 2014

(54) METHOD FOR BONDING THIN FILM PIECE

(71) Applicant: Sumitomo Electric Industries, Ltd., Osaka (JP)

(72) Inventor: Akira Furuya, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 93 days.

(21) Appl. No.: 13/627,150

(22) Filed: Sep. 26, 2012

(65) Prior Publication Data

US 2013/0075023 A1  Mar. 28, 2013

(30) Foreign Application Priority Data

Sep. 26, 2011 (JP) ................... 2011-209773

(51) Int. Cl.
| | |
|---|---|
| *B29C 65/52* | (2006.01) |
| *B32B 37/26* | (2006.01) |
| *B29C 63/48* | (2006.01) |
| *B44C 1/17* | (2006.01) |
| *B44C 1/175* | (2006.01) |
| *B32B 37/12* | (2006.01) |
| *B32B 38/10* | (2006.01) |
| *B32B 43/00* | (2006.01) |
| *B29C 33/52* | (2006.01) |
| *C08J 5/12* | (2006.01) |
| *H01L 21/683* | (2006.01) |

(52) U.S. Cl.
CPC .............. *B44C 1/1733* (2013.01); *B44C 1/175* (2013.01); *B32B 37/12* (2013.01); *B32B 38/10* (2013.01); *B32B 43/006* (2013.01); *B29C 33/52* (2013.01); *C08J 5/122* (2013.01); *H01L 21/6835* (2013.01)

USPC ............ 156/155; 156/239; 156/249; 156/704

(58) Field of Classification Search
CPC ........ B44C 1/1733; B44C 1/175; B32B 7/12; B32B 38/10; B32B 43/006; B29C 33/52; C08J 5/122; H01L 21/6835
USPC ............. 156/63, 83, 152, 155, 230, 234–237, 156/239, 241, 247, 249, 702–704
See application file for complete search history.

(56) References Cited

U.S. PATENT DOCUMENTS 4,081,282 A * 3/1978 Merrill et al. ............... 430/273.1
4,329,779 A * 5/1982 England ......................... 29/840

(Continued)

FOREIGN PATENT DOCUMENTS

| JP | 2006108421 A * | 4/2006 | ............ H01L 21/52 |
| WO | WO 9940760 A1 * | 8/1999 | ............ H01L 21/52 |

OTHER PUBLICATIONS

English Abstract of JP 2006-108421 (Feb. 21, 2014).*

(Continued)

*Primary Examiner* — Sing P Chan
(74) *Attorney, Agent, or Firm* — Westerman, Hattori, Daniels & Adrian, LLP (57) ABSTRACT

A method for bonding a thin film piece includes: forming a support layer on each upper face of a plurality of thin film pieces; fixing the plurality of thin film pieces to a first substrate through a temporary fixing layer provided on a lower face of the first substrate so that the temporary fixing layer contacts with the upper face and at least a part of a side face of each support layer; bonding a lower face of the plurality of thin film pieces to a second substrate; and removing the first substrate from the plurality of thin film pieces by removing at least one of the support layer and the temporary fixing layer.

12 Claims, 6 Drawing Sheets

(56) References Cited

U.S. PATENT DOCUMENTS

| | | | | |
|---|---|---|---|---|
| 4,439,506 | A * | 3/1984 | Ohta et al. | 430/58.6 |
| 4,992,353 | A * | 2/1991 | Rodakis et al. | 430/213 |
| 5,171,650 | A * | 12/1992 | Ellis et al. | 430/20 |
| 5,871,884 | A * | 2/1999 | Ellis | 430/201 |
| 6,104,610 | A * | 8/2000 | Tilton et al. | 361/699 |
| 6,108,201 | A * | 8/2000 | Tilton et al. | 361/689 |
| 6,127,199 | A * | 10/2000 | Inoue et al. | 438/30 |
| 6,192,964 | B1 * | 2/2001 | Cianci et al. | 160/173 R |
| 6,296,732 | B1 * | 10/2001 | Enlow et al. | 156/209 |
| 6,410,201 | B2 * | 6/2002 | Wolk et al. | 430/200 |
| 6,423,466 | B2 * | 7/2002 | Hare et al. | 430/263 |
| 6,441,739 | B2 * | 8/2002 | Ruhrig et al. | 340/572.6 |
| 6,505,667 | B2 * | 1/2003 | Levy et al. | 160/236 |
| 6,638,682 | B2 * | 10/2003 | Hare et al. | 430/256 |
| RE38,466 | E * | 3/2004 | Inoue et al. | 438/30 |
| 6,864,295 | B2 * | 3/2005 | Mitarai | 521/50.5 |
| 6,887,650 | B2 * | 5/2005 | Shimoda et al. | 430/311 |
| 6,913,985 | B2 * | 7/2005 | Ogihara et al. | 438/462 |
| 6,975,035 | B2 * | 12/2005 | Lee | 257/778 |
| 7,087,460 | B2 * | 8/2006 | Lee | 438/110 |
| 7,122,907 | B2 * | 10/2006 | Lee | 257/778 |
| 7,161,237 | B2 * | 1/2007 | Lee | 257/698 |
| 7,348,215 | B2 * | 3/2008 | Lee | 438/108 |
| RE40,601 | E * | 12/2008 | Inoue et al. | 257/59 |
| 7,531,906 | B2 * | 5/2009 | Lee | 257/778 |
| 7,534,660 | B2 * | 5/2009 | Lee | 438/123 |
| 7,873,309 | B2 * | 1/2011 | Mestha et al. | 399/266 |
| 8,238,027 | B2 * | 8/2012 | Tompkin et al. | 359/569 |
| 8,286,880 | B2 * | 10/2012 | Hansen et al. | 235/487 |
| 8,449,969 | B2 * | 5/2013 | Keller et al. | 428/195.1 |
| 8,652,596 | B2 * | 2/2014 | Kaneuchi et al. | 428/32.52 |
| 2001/0004004 | A1 * | 6/2001 | Levy et al. | 160/236 |
| 2001/0035821 | A1 * | 11/2001 | Ruhrig et al. | 340/572.6 |
| 2001/0044013 | A1 * | 11/2001 | McDonough et al. | 428/202 |
| 2003/0022403 | A1 * | 1/2003 | Shimoda et al. | 438/14 |
| 2003/0164541 | A1 * | 9/2003 | Lee | 257/686 |
| 2003/0164548 | A1 * | 9/2003 | Lee | 257/738 |
| 2003/0166312 | A1 * | 9/2003 | Lee | 438/107 |
| 2004/0016504 | A1 * | 1/2004 | Mitarai | 156/247 |
| 2004/0159957 | A1 * | 8/2004 | Lee | 257/778 |
| 2004/0197952 | A1 * | 10/2004 | Lee | 438/107 |
| 2004/0197955 | A1 * | 10/2004 | Lee | 438/108 |
| 2004/0259331 | A1 * | 12/2004 | Ogihara et al. | 438/462 |
| 2005/0104634 | A1 * | 5/2005 | Fujishima | 327/117 |
| 2005/0106839 | A1 * | 5/2005 | Shimoda et al. | 438/458 |
| 2005/0173052 | A1 * | 8/2005 | Mitarai | 156/247 |
| 2006/0284312 | A1 * | 12/2006 | Lee | 257/734 |
| 2007/0069393 | A1 * | 3/2007 | Asahi et al. | 257/780 |
| 2007/0273142 | A1 * | 11/2007 | Tompkin et al. | 283/72 |
| 2009/0190967 | A1 * | 7/2009 | Mestha et al. | 399/266 |
| 2010/0253059 | A1 * | 10/2010 | Hansen et al. | 283/75 |
| 2010/0308570 | A1 * | 12/2010 | Heim | 283/67 |
| 2011/0224182 | A1 * | 9/2011 | Bullock et al. | 514/182 |
| 2012/0031978 | A1 * | 2/2012 | Hansen et al. | 235/488 |
| 2012/0134065 | A1 * | 5/2012 | Furuya et al. | 361/234 |
| 2012/0237702 | A1 * | 9/2012 | Kaneuchi et al. | 428/32.69 |
| 2012/0287674 | A1 * | 11/2012 | Nichol et al. | 362/611 |
| 2012/0314388 | A1 * | 12/2012 | Bower et al. | 361/760 |
| 2013/0075023 | A1 * | 3/2013 | Furuya | 156/230 |
| 2013/0273695 | A1 * | 10/2013 | Menard et al. | 438/118 |

OTHER PUBLICATIONS

Machine English translation of JP 2006-108421 (Feb. 21, 2014).*
Bowers, John E. et al., "Integration Using the Hybrid Silicon Platform", ECOC 2009, Sep. 20-24, 2009.

* cited by examiner

METHOD FOR BONDING THIN FILM PIECE

CROSS-REFERENCE TO RELATED APPLICATION

This application is based upon and claims the benefit of priority of the prior Japanese Patent Application No. 2011-209773, filed on Sep. 26, 2011, the entire contents of which are incorporated herein by reference.

BACKGROUND (i) Technical Field

The present invention relates to a method for bonding a thin film piece, in particular, relates to a method for bonding a plurality of thin film pieces to a substrate.

(ii) Related Art

A method for bonding a semiconductor element or the like to a substrate is being developed. For example, ECOC 2009, 20-24 Sep., 2009, Vienna, Austria discloses a method for bonding InGaAsP/InP to a silicon (Si) substrate. There is known a method for bonding a plurality of thin film pieces to a substrate, as the method for bonding the semiconductor element or the like to the substrate.

SUMMARY

It is an object to restrain pollution of a bond face of a thin film piece and peeling of the thin film piece from a support layer.

According to an aspect of the present invention, there is provided a method for bonding a thin film piece including: forming a support layer on each upper face of a plurality of thin film pieces; fixing the plurality of thin film pieces to a first substrate through a temporary fixing layer provided on a lower face of the first substrate so that the temporary fixing layer contacts with the upper face and at least a part of a side face of each support layer; bonding a lower face of the plurality of thin film pieces to a second substrate; and removing the first substrate from the plurality of thin film pieces by removing at least one of the support layer and the temporary fixing layer.

DETAILED DESCRIPTION

In order to bond a plurality of thin film pieces to a substrate, a method of fixing an upper face of the plurality of thin film pieces to a temporary substrate through a temporary fixing layer or the like and bonding a lower face of the thin film pieces to the substrate. In this case, when the temporary fixing layer is thick, the lower face (bond face) of the thin film pieces may be contaminated by the temporary fixing layer, because the surface of the temporary fixing layer is close to the bond face of the thin film pieces. On the other hand, when the temporary fixing layer is thin, the thin film pieces may be peeled from the temporary fixing layer.

Figure 1A:
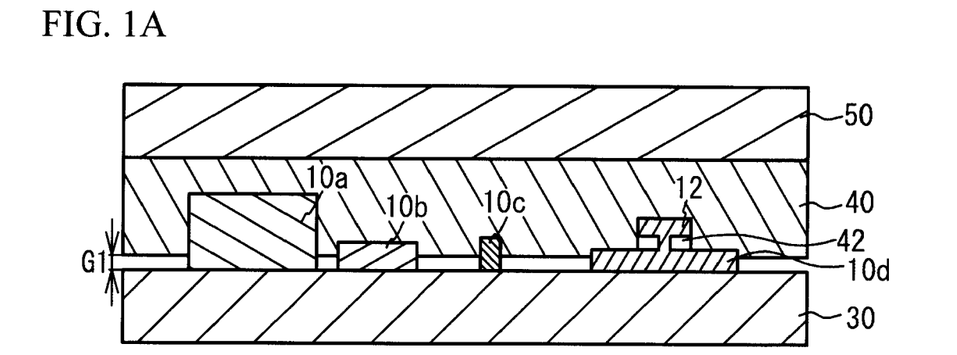
FIG. 1A through FIG. 1C illustrate a cross sectional view of a method for bonding a plurality of thin film pieces in accordance with a comparative example.
Figure 1B:
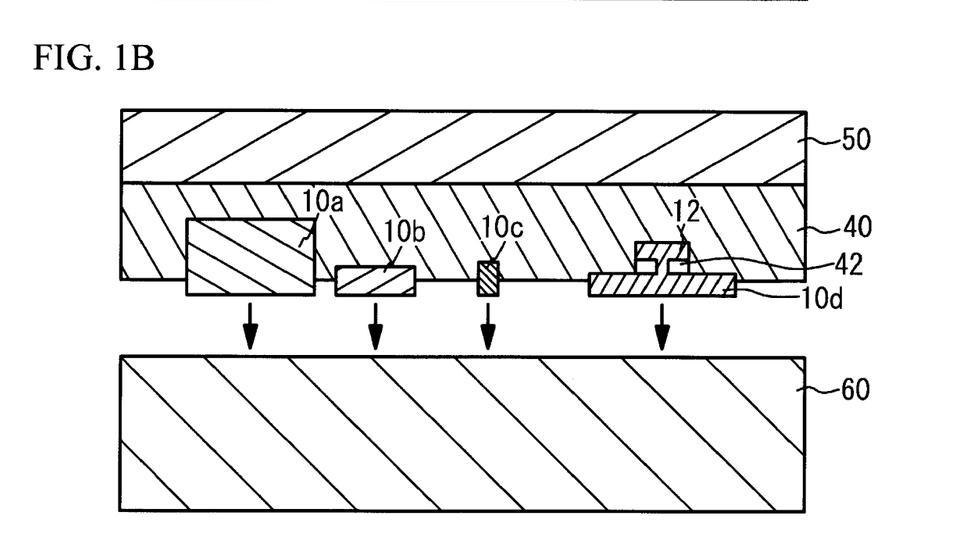
Figure 1C:
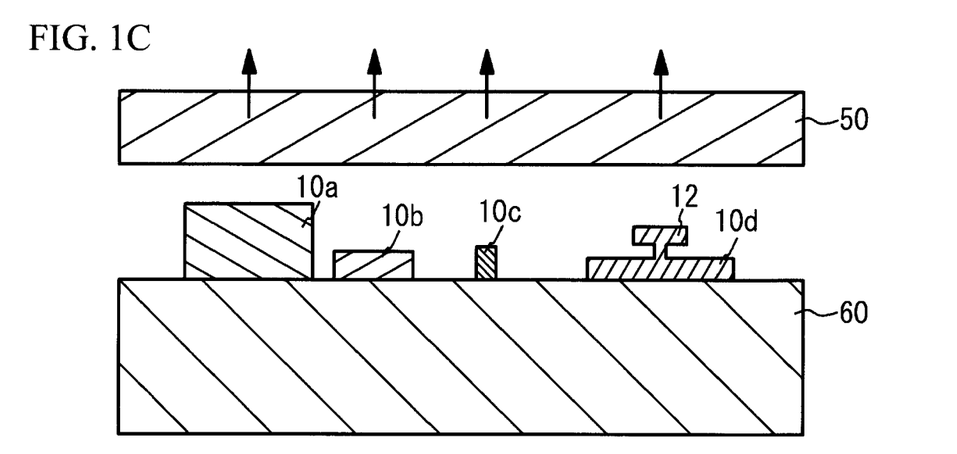

A description will be given of a method for bonding a plurality of thin film pieces with use of a temporary fixing layer. FIG. 1A through FIG. 1C illustrate a cross sectional view of the method for bonding a plurality of thin film pieces in accordance with a comparative example. As illustrated in FIG. 1A, a plurality of thin film pieces 10a through 10d are arrayed on a substrate 30. For example, a thickness and an area of a lower face of the thin film pieces 10a through 10d are different from each other. The thin film piece 10d has an overhang portion 12. The overhang portion 12 has a shape of a gate electrode of a transistor. A substrate 50 having a temporary fixing layer 40 under a lower face thereof is pressed to an upper face of the substrate 30 having the structure above. Thus, the thin film pieces 10a through 10d are buried in the temporary fixing layer 40. After that, the temporary fixing layer 40 is hardened by radiating ultraviolet rays to the temporary fixing layer 40.

As illustrated in FIG. 1B, the thin film pieces 10a through 10d are peeled from the substrate 30 and are bonded to a substrate 60 (with reference to arrows of FIG. 1B). In the bonding process, an Ar ion is radiated to the lower face of the thin film pieces 10a through 10d and the upper face of the substrate 60 in a vacuum chamber, the lower face of the thin film pieces 10a through 10d and the upper face of the substrate 60 are activated, and the thin film pieces 10a through 10d are bonded to the substrate 60. Alternatively, the thin film pieces 10a through 10d and the substrate 60 may be pressed to each other and subjected to a thermal treatment. The bonding method may be properly selected. As illustrated in FIG. 1C, the substrate 50 is peeled from the thin film pieces 10a through 10d by dissolving the temporary fixing layer 40 in solvent (with reference to arrows in FIG. 1C). With the processes, the thin film pieces 10a through 10d are bonded to the substrate 60.

As illustrated in FIG. 1A, the thin film pieces 10a through 10d are thin so that handling of the thin film pieces 10a through 10d with use of tweezers is difficult. For example, at least one of the thin film pieces 10a through 10d has a thickness of a few μm to a few hundreds of μm. Therefore, in order to temporarily fix the thin film pieces 10a through 10d with use of the temporary fixing layer 40, a gap G1 between a lower face of the temporary fixing layer 40 and the substrate 30 is reduced. Therefore, the lower face of the thin film pieces 10a through 10d may be contaminated because of the component of the temporary fixing layer 40. On the other hand, when the gap G1 is large, a contact area between the thin film piece 10c and the temporary fixing layer 40 is reduced, because an area of an upper face of the thin film piece 10c is small. Therefore, the thin film piece 10c may be peeled from the temporary fixing layer 40. Further, a cavity 42 may be formed under the overhang portion 12, because the thin film piece 10d has the overhang portion 12. If the cavity 42 is formed, the cavity 42 may explode when the cavity 42 is subjected to a vacuum atmosphere in a vacuum chamber or is subjected to a thermal treatment.

In the following embodiments, a support layer is provided on the upper face of the thin film pieces 10a through 10d in order to solve the above-mentioned problem.

[First Embodiment]

Figure 2A:
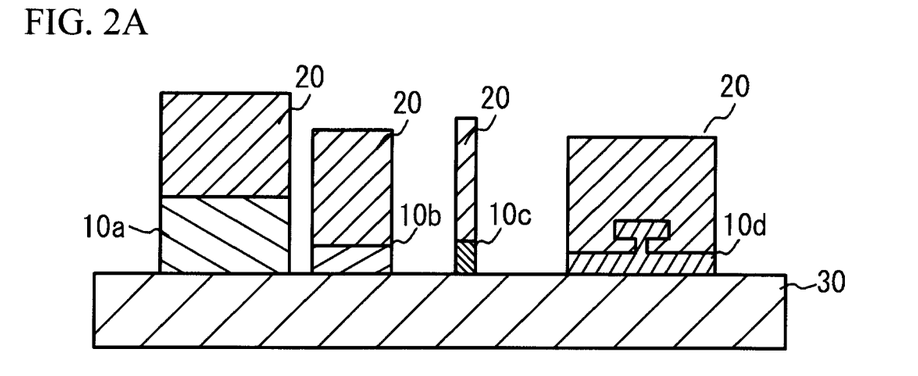
FIG. 2A through FIG. 2C illustrate a cross sectional view of a method for bonding a thin film piece in accordance with a first embodiment.

FIG. 2A through FIG. 3B illustrate a cross sectional view of a method for bonding a thin film piece in accordance with a first embodiment. The thin film pieces may employ a semiconductor device, for example, FET (Field Effect Transistor), HEMT (High Electron Mobility Transistor), Semiconductor laser, Semiconductor light receiving element and other electrically or optically passive elements. As illustrated in FIG. 2A, the plurality of thin film pieces 10a through 10d are arrayed on the substrate 30 (third substrate) such as a sapphire substrate. The plurality of thin film pieces 10a through 10d may be just placed on an upper face of the substrate 30, or may be adsorbed to the substrate 30. A vacuum adsorption method, an electrostatic adsorption method or the like may be used as a method of adsorbing the plurality of thin film pieces 10a through 10d to the substrate 30. A support layer 20 is formed on each upper face of the plurality of thin film pieces 10a through 10d. It is preferable that the support layer 20 is at least thicker than the thickest thin film piece. The thickness of the support layer 20 may be a few µm to a few hundreds µm. It is not necessary that all of the support layers 20 formed on the thin film pieces 10a through 10d have the same thickness. The support layers 20 formed on the thin film pieces 10a through 10d may properly have a different thickness. A photo resist or the like may be used as the support layer 20. The forming method of the support layer 20 is described later.

Figure 2B:
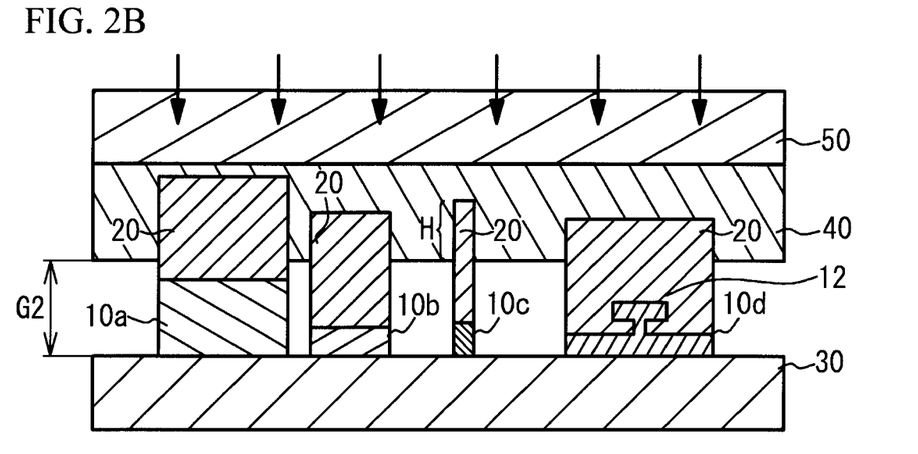

As illustrated in FIG. 2B, the temporary fixing layer 40 such as ultraviolet cure adhesive is coated on a lower face of the substrate 50 (first substrate) such as a sapphire substrate. A thickness of the temporary fixing layer 40 may be properly set according to the thickness of the support layer 20. The thickness of the temporary fixing layer 40 is, for example, 20 µm. The substrate 50 is pressed to the support layer 20 with reference to arrows of FIG. 2B. Thus, a part of the support layer 20 is buried in the temporary fixing layer 40. Thus, all of the upper face and at least a part of the side face of the support layer 20 contacts with the temporary fixing layer 40. When ultraviolet ray is radiated through the substrate 50, the temporary fixing layer 40 is hardened. Thus, the plurality of the thin film pieces 10a through 10d are temporarily fixed to the substrate 30 through the temporary fixing layer 40. A thermoplastic resin or the like may be used as the temporary fixing layer 40. However, when ultraviolet cure adhesive medium is used as the temporary fixing layer 40, the pressing and the temporary fixing of the substrate 30 can be performed in an ambient temperature.

Figure 2C:
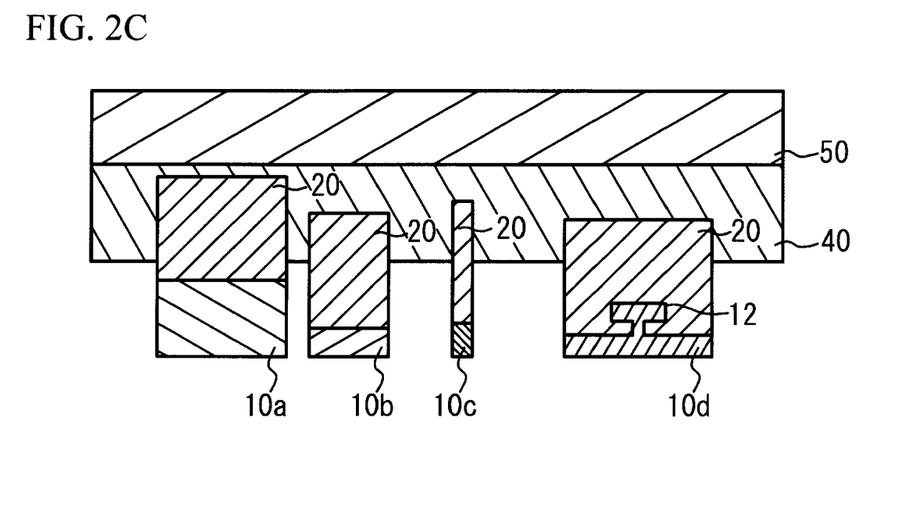

As illustrated in FIG. 2C, the substrate 30 is peeled. When the plurality of thin film pieces 10a through 10d are not fixed to the substrate 30, the substrate 30 has only to be detached. When the plurality of thin film pieces 10a through 10d are adsorbed to the substrate 30, the adsorption force has only to be released.

Figure 3A:
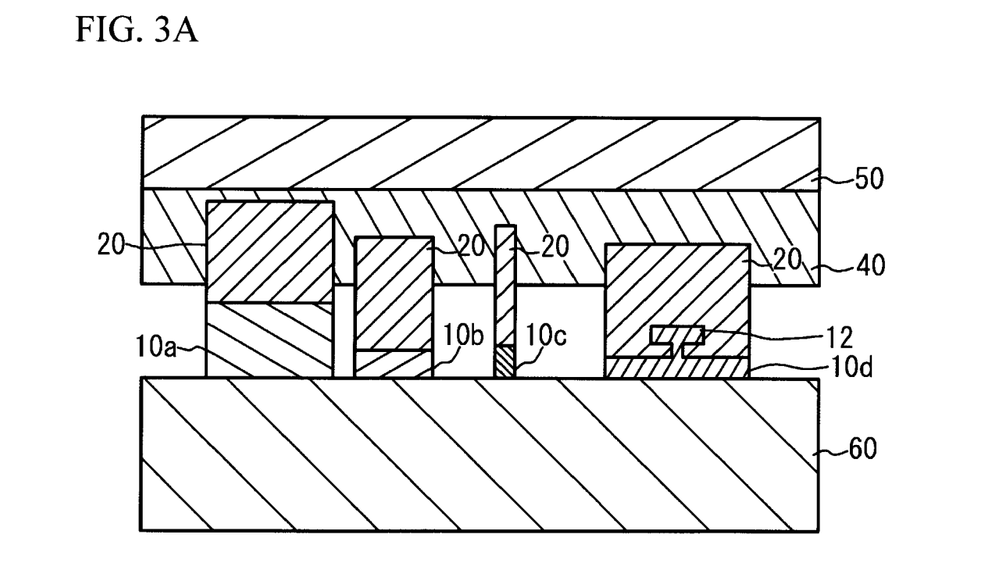
FIG. 3A and FIG. 3B illustrate a cross sectional view of a method for bonding a thin film piece in accordance with the first embodiment.

As illustrated in FIG. 3A, the lower faces of the plurality of thin film pieces 10a through 10d are bonded to the upper face of the substrate 60 (second substrate) such as a SiC (silicon carbide) substrate. A surface activation bonding method may be used as the bonding method. For example, the lower faces of the thin film pieces 10a through 10d and the upper face of the substrate 60 are subjected to radiation of an Ar ion in a super-high vacuum. Thus, the surface is activated. When the lower faces of the thin film pieces 10a through 10d contacts with the upper face of the substrate 60 in the ambient temperature, the thin film pieces 10a through 10d are bonded to the substrate 60. Bonding methods may be properly selected. For example, the thin film pieces 10a through 10d may be pressed to the substrate 60 and may be subjected to a thermal process.

Figure 3B:
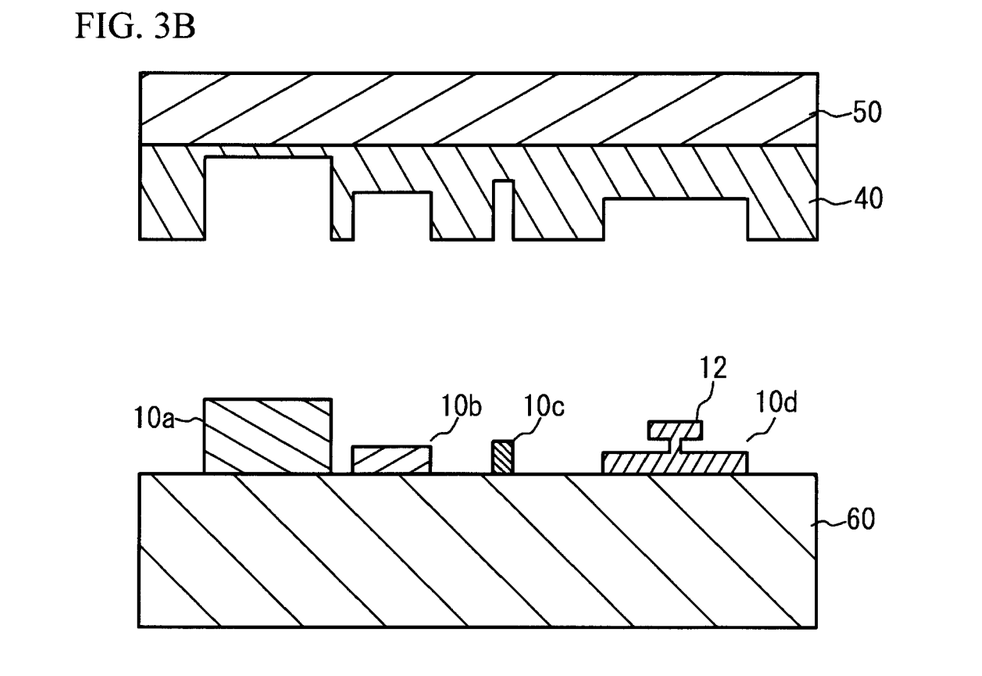

As illustrated in FIG. 3B, the substrates 50 and 60 are immersed into a solvent in which the support layer 20 is soluble. For example, when the support layer 20 is a photo resist, an organic solvent such as acetone can be used as the solvent. The thin film pieces 10a through 10d can be peeled from the substrate 50 when the support layer 20 is dissolved, because the temporary fixing layer 40 does not reach the thin film pieces 10a through 10d. The substrate 50 can be peeled from the thin film pieces when at least one of the support layer 20 and the temporary fixing layer 40 is removed. With the processes, the substrate 60 can be bonded to the thin film pieces 10a through 10d.

In accordance with the first embodiment, as illustrated in FIG. 2B, the support layer 20 is provided on the upper faces of the thin film pieces 10a through 10d. The temporary fixing layer 40 contacts with the upper face and at least a part of the side face of each support layer 20 and temporarily fixes the thin film pieces 10a through 10d. Thus, a gap G2 between the lower face of the temporary fixing layer 40 and the substrate 30 can be enlarged. Therefore, it is restrained that the lower faces of the thin film pieces 10a through 10d are contaminated by the components of the temporary fixing layer 40. A height H of the side face of the support layer 20 contacting with the temporary fixing layer 40 can be enlarged with respect to the thin film piece 10c of which upper face area is small. Therefore, a contact area between the support layer 20 and the temporary fixing layer 40 gets larger. Therefore, it is restrained that the thin film piece 10c is peeled from the temporary fixing layer 40.

The thin film pieces 10a through 10d may be have an identical size. However, when a thickness of at least one of the plurality of thin film pieces is different from that of others, the buried depth of the thin film pieces 10a through 10d into the temporary fixing layer 40 is different from each other as well as the comparative example illustrated in FIG. 1A through FIG. 1D. It is therefore difficult to bury all of the thin film pieces 10a through 10d into the temporary fixing layer 40 by adequate depth. On the other hand, in accordance with the first embodiment, the support layer 20 is buried in the temporary fixing layer 40. It is therefore possible to sufficiently temporarily fix all of the thin film pieces 10a thorough 10d, because the support layer 20 is buried in the temporary fixing layer 40.

When at least one of the thin film pieces has the overhang portion 12, the cavity 42 may be formed below the overhang portion 12 of the thin film piece 10d as in the case of FIG. 1A in the comparative example. On the other hand, in accordance with the first embodiment, the formation of the cavity below the overhang portion 12 of the thin film piece 10d is restrained with use of the temporary fixing layer 40, when the lower portion of the overhang portion 12 is buried by the support layer 20.

In the first embodiment, as illustrated in FIG. 2A, the thin film pieces 10a through 10d are arrayed on the substrate 30, before temporarily fixing the thin film pieces 10a through 10d to the substrate 50 through the temporary fixing layer 40. Thus, the lower faces of the thin film pieces 10a through 10d are arrayed on an identical plane. Therefore, as illustrated in FIG. 3A, the thin film pieces 10a through 10d are bonded to the substrate 60 without a clearance, when the thin film pieces 10a through 10d are jointed to the substrate 60.

Figure 4A:
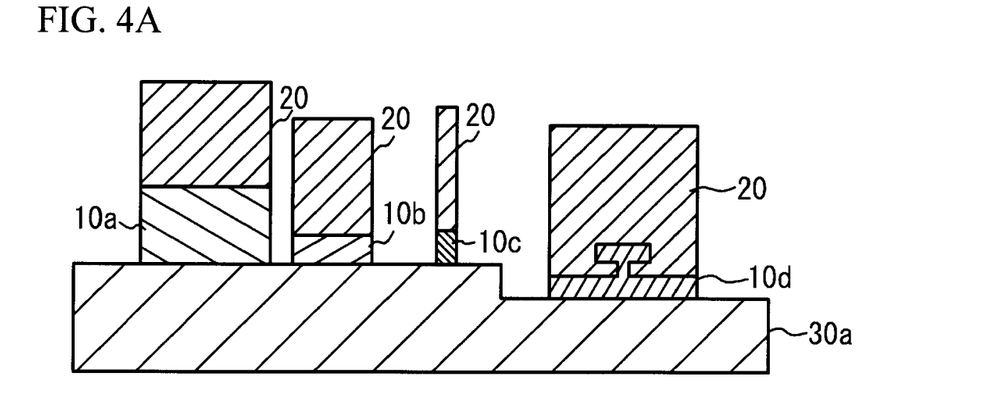
FIG. 4A and FIG. 4B illustrate a cross sectional view of a modified embodiment of the first embodiment.
Figure 4B:
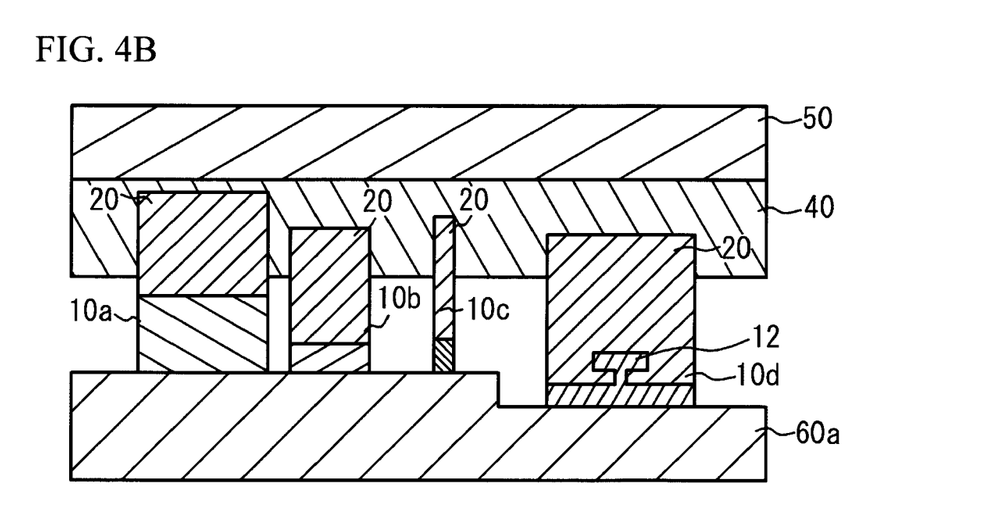

FIG. 4A and FIG. 4B illustrate a cross sectional view of a modified embodiment of the first embodiment. As illustrated in FIG. 4A, the thin film pieces 10a through 10d are arrayed on a substrate 30a having concavity and convexity. After that, the processes of FIG. 2B through FIG. 2C of the first embodiment are performed. As illustrated in FIG. 4B, the thin film pieces 10a through 10d are jointed to a substrate 60a having concavity and convexity corresponding to the concavity and convexity of the substrate 30a. After that, the process of FIG. 3B is performed.

As mentioned above, it is preferable that the concavity and convexity of the upper face of the substrate 30a corresponds to the concavity and convexity of the upper face of the substrate 60a. Thus, the thin film pieces 10a thorough 10d are bonded to the substrate 60a without a clearance.

Figure 5A:
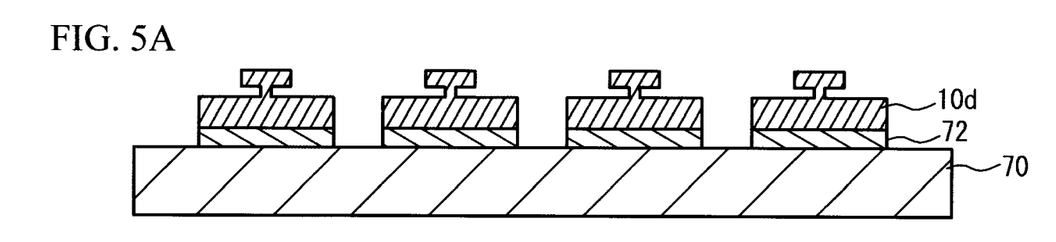
FIG. 5A through FIG. 5C illustrate a cross sectional view of a method for forming a support layer on a thin film piece.

FIG. 5A through FIG. 6C illustrate a cross sectional view of a method for forming the support layer on the thin film pieces. A description will be given of the thin film piece 10d as the thin film piece. As illustrated in FIG. 5A, a sacrifice layer 72 formed with AlAs or the like is formed on a substrate 70 (fourth substrate) such as a GaAs substrate, and a semiconductor device is formed on the sacrifice layer 72. The semiconductor device corresponds to the thin film piece 10d. The semiconductor device is a semiconductor device using a compound semiconductor between III-group and V-group, for example. Each semiconductor device is separated from each other by an etching to the substrate 70.

Figure 5B:
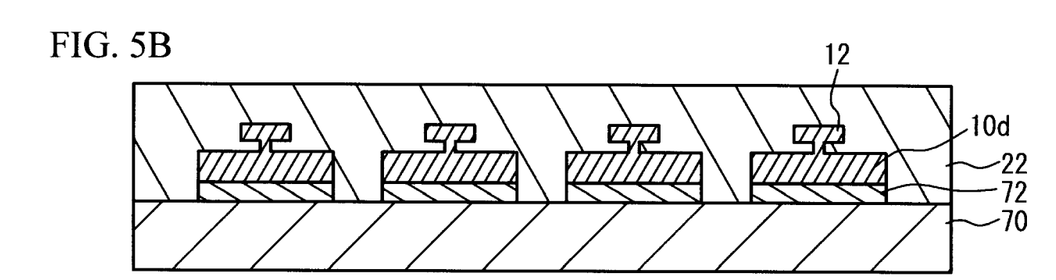

As illustrated in FIG. 5B, a photo resist is coated on the substrate 70. For example, liquid photo resist having low viscosity is dropped on the upper face of the substrate 70, and the photo resist is coated by a spin coat. Thus, a coated layer of the photo resist is formed on the thin film piece 10d. After that, the coated layer is prebaked. Thus, a first support layer 22 is made from the coated layer. It is restrained that a cavity is formed under the overhang portion 12, because the photo resist has low viscosity.

Figure 5C:
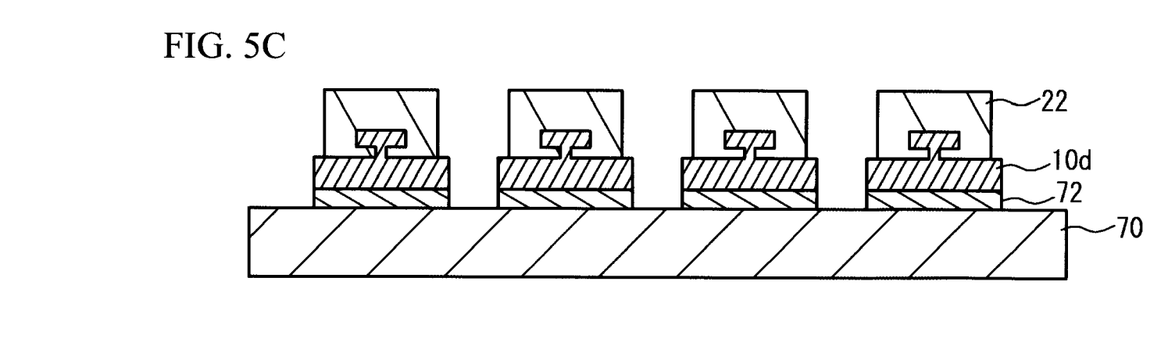

As illustrated in FIG. 5C, the first support layer 22 is formed on each of the semiconductor devices (that is, a thin film piece). The first support layer is formed by applying expose and development process to the coated layer. The expose process uses a photo mask that has a pattern of the first support layer. In this case, the width of the first support layer 22 may be the same as that of the semiconductor device. However, as illustrated in FIG. 5C, the width of the first support layer 22 may be slightly smaller than that of the semiconductor device. The first support layer 22 may be a resin other than the photo resist, and may be separated by an etching method.

Figure 6A:
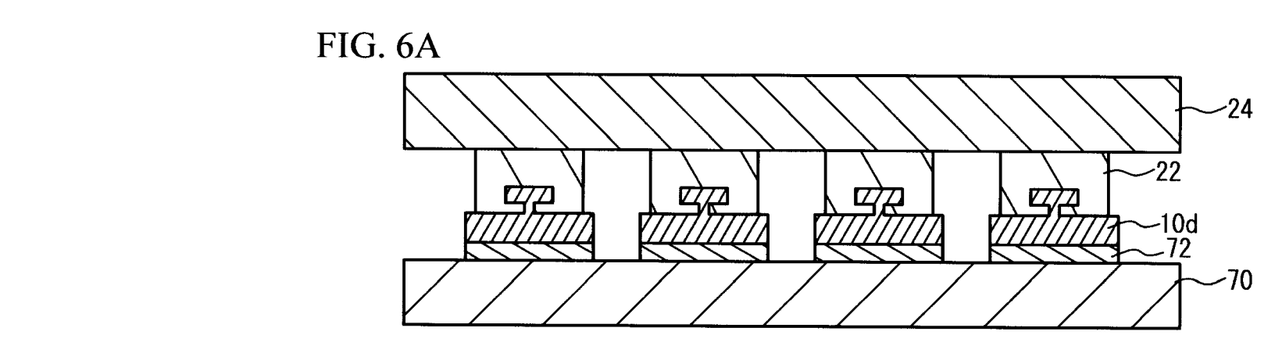
FIG. 6A through FIG. 6C illustrate a cross sectional view of a method for forming a support layer on a thin film piece.
Figure 6B:
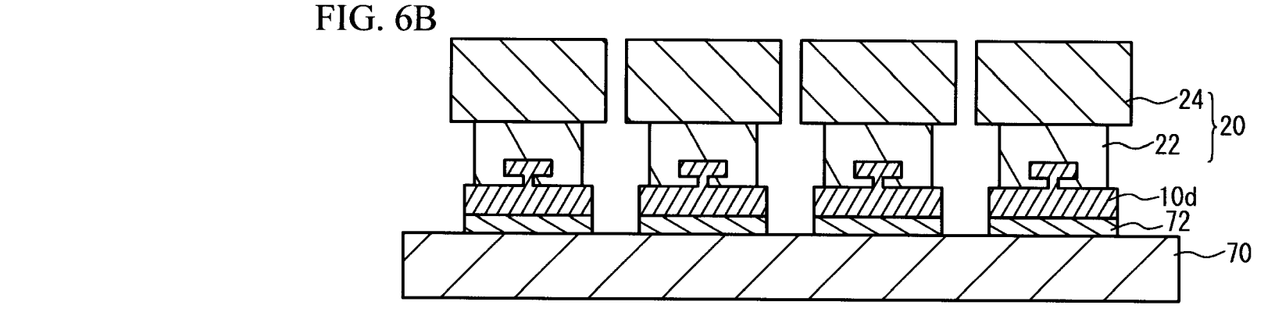

As illustrated in FIG. 6A, a second support layer 24 is formed on the first support layer 22. The second support layer 24 is composed of a film-shaped resist. As illustrated in FIG. 6B, the second support layer 24 is formed by applying expose and development process to the second support layer 24. The expose process uses a photo mask that has a pattern of the second support layer. The second support layer 24 is patterned above each of the first support layer 22 after the exposure and development processes are completed. The width of the second support layer 24 may be the same as that of the first support layer 22. However, as illustrated in FIG. 6B, the width of the second support layer 24 may be different from that of the first support layer 22. The second support layer 24 may be a resin other than the photo resist, and may be separated by an etching method. The first support layer 22 and the second support layer 24 act as the support layer 20.

Figure 6C:
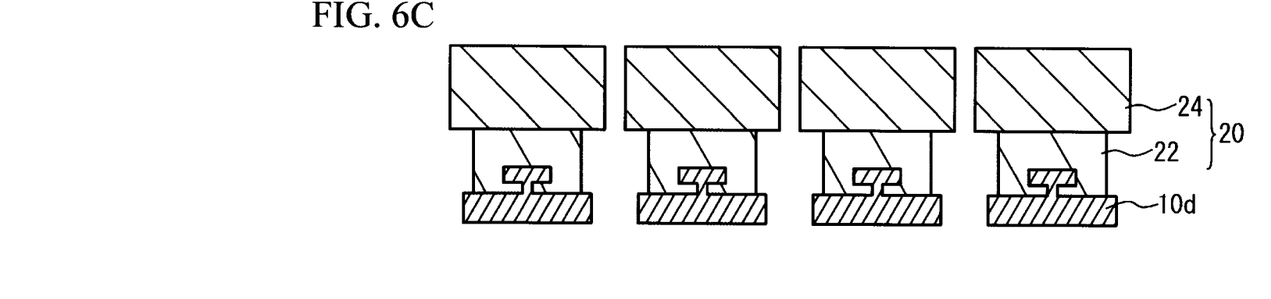

As illustrated in FIG. 6C, the substrate 70 is immersed in diluted hydrofluoric acid. A sacrifice layer formed with AlAs is selectively dissolved. Thus, the thin film piece 10d on which the support layer 20 is formed is separated into a piece. As illustrated in FIG. 6C, there is a method of performing an etching of the sacrifice layer as a method of peeling the thin film piece from the substrate 70. There are methods of performing an etching of a substrate selectively, grinding a substrate or the like, other than the method.

In a case where the overhang portion 12 is not formed, or a case where a sufficient thickness is secured by the first support layer 22, only the first support layer 22 may act as the support layer 20 without the second support layer 24.

However, it is preferable that the process of forming the support layer 20 includes a process of forming the first support layer 22 from a coated layer coated on at least one of a plurality of thin film pieces arrayed on the substrate 70 and a process of forming the second support layer 24 having a viscosity higher than that of the coated layer, on the first support layer 22. The first support layer 22 is formed by coating the coated layer having a low viscosity.

Thus, it is easy to bury a device acting as a thin film piece. When the second support layer 24 having a high viscosity is used, the support layer 20 can be thick.

In the above embodiments, a compound semiconductor device of III-group and V-group acting as a thin film piece is bonded on the SiC substrate. However, other devices or other components may be jointed on a preferable substrate.

The present invention is not limited to the specifically disclosed embodiments and variations but may include other embodiments and variations without departing from the scope of the present invention.

What is claimed is:

1. A method for bonding a thin film piece comprising:
   forming a support layer on each upper face of a plurality of thin film pieces;
   fixing the plurality of thin film pieces to a first substrate through a temporary fixing layer provided on a lower face of the first substrate so that the temporary fixing layer contacts with the upper face and at least a part of a side face of each support layer;
   bonding a lower face of the plurality of thin film pieces to a second substrate; and
   removing the first substrate from the plurality of thin film pieces by removing at least one of the support layer and the temporary fixing layer.

2. The method as claimed in claim 1, wherein a thickness of at least one of the plurality of thin film pieces is different from a thickness of other thin film pieces.

3. The method as claimed in claim 1 further comprising arranging the plurality of thin film pieces on a third substrate before fixing the plurality of thin film pieces to the first substrate through the temporary fixing layer.

4. The method as claimed in claim 3 wherein an upper face of the third substrate having a plurality of areas, at least one of the areas in the upper face of the third substrate having a height of surface different from the other area.

5. The method as claimed in claim 4 wherein an upper face of the second substrate having a plurality of areas, a height of a surface of each area of the second substrate corresponding to the height of the surface of each area of the third substrate.

6. The method as claimed in claim 3, wherein the plurality of thin film pieces are fixed to the third substrate by a vacuum adsorption or an electrostatic adsorption.

7. The method as claimed in claim 1, wherein the forming of the support layer comprises:
   applying a coated layer on the plurality of thin film pieces arranged on a fourth substrate;
   forming a first support layer by patterning the coated layer to form a pattern of the first support layer that covers at least one of the plurality of thin film pieces; and
   forming a second support layer on the first support layer, the second support layer having viscosity higher than that of the coated layer.

8. The method as claimed in claim 7, wherein at least one of the plurality of thin film pieces has an overhang portion on its surface.

9. The method as claimed in claim 1, wherein the second substrate is comprised of SiC.

10. The method as claimed in claim 1, wherein the bonding of the lower face of the plurality of thin film pieces to the second substrate is using a surface activation bonding method.

11. The method as claimed in claim 1, wherein the temporary fixing layer is comprised by an ultraviolet cure adhesive medium.

12. The method as claimed in claim 1, wherein the first substrate is comprised by sapphire.

* * * * *